United States Patent
Fan et al.

(10) Patent No.: US 11,132,160 B2
(45) Date of Patent: Sep. 28, 2021

(54) ELECTRONIC TERMINAL AND DISPLAY SCREEN HAVING A CAMERA UNDER A DISPLAY AREA

(71) Applicant: Yungu (Gu'an) Technology Co., Ltd., Langfang (CN)

(72) Inventors: Longfei Fan, Langfang (CN); Hui Zhu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/595,476

(22) Filed: Oct. 8, 2019

(65) Prior Publication Data
US 2020/0034100 A1    Jan. 30, 2020

Related U.S. Application Data

(63) Continuation of application No. PCT/CN2018/091335, filed on Jun. 14, 2018.

(30) Foreign Application Priority Data

Sep. 30, 2017  (CN) .......................... 201710920204.0
Sep. 30, 2017  (CN) .......................... 201721289245.6

(51) Int. Cl.
*G06F 3/14* (2006.01)
*G09G 3/3216* (2016.01)
(Continued)

(52) U.S. Cl.
CPC ......... *G06F 3/1423* (2013.01); *G09G 3/3216* (2013.01); *G09G 3/3225* (2013.01);
(Continued)

(58) Field of Classification Search
CPC ...... G06F 3/1423; G09G 3/32; G09G 3/3216; G09G 3/3225; H01L 27/3244;
(Continued)

(56) References Cited

U.S. PATENT DOCUMENTS 10,007,328 B2   6/2018  Lee et al.
10,331,164 B2   6/2019  Bao
(Continued)

FOREIGN PATENT DOCUMENTS

CN    104423794 A    3/2015
CN    104536179 A    4/2015
(Continued)

OTHER PUBLICATIONS

CN First Office Action dated Oct. 8, 2019 in the corresponding CN application (application No. 201710920204.0).
(Continued)

*Primary Examiner* — Jason M Mandeville
(74) *Attorney, Agent, or Firm* — Kilpatrick Townsend & Stockton

(57) ABSTRACT

The present disclosure relates to a display screen and an electronic terminal. The display screen includes a display region including a first display area and a second display area. The first display area has a screen as a first screen, and the second display area has a screen as a second screen. A light transmittance of the first screen is greater than a light transmittance of the second screen. The electronic terminal includes a terminal body, the above display screen, a front device and a control device. The above display screen and electronic terminal can improve the full screen display effect.

15 Claims, 7 Drawing Sheets

(51) Int. Cl.
*G09G 3/3225* (2016.01)
*H01L 27/32* (2006.01)
*H04M 1/02* (2006.01)
*G02F 1/1333* (2006.01)

(52) U.S. Cl.
CPC ...... *H01L 27/3244* (2013.01); *H01L 27/3276* (2013.01); *H01L 27/3281* (2013.01); *H01L 27/3288* (2013.01); *H04M 1/0264* (2013.01); *H04M 1/0266* (2013.01); *G02F 1/1333* (2013.01)

(58) Field of Classification Search
CPC ............ H01L 27/3276; H01L 27/3281; H01L 27/3288; H04M 1/0264; H04M 1/0266; G02F 1/1333
USPC .......................................................... 345/1.3
See application file for complete search history.

(56) References Cited

U.S. PATENT DOCUMENTS

| | | | |
|---|---|---|---|
| 2006/0061524 A1* | 3/2006 | Suh | G09G 3/3216 345/76 |
| 2013/0076593 A1 | 3/2013 | Reeves et al. | |
| 2015/0074589 A1 | 3/2015 | Pan et al. | |
| 2016/0343787 A1* | 11/2016 | Wu | H01L 27/3262 |
| 2016/0351648 A1* | 12/2016 | Ek | H01L 27/3225 |
| 2016/0366255 A1 | 12/2016 | Chu et al. | |
| 2017/0194416 A1* | 7/2017 | Chen | H01L 51/5234 |
| 2018/0121082 A1 | 5/2018 | Zhu et al. | |
| 2018/0260079 A1 | 9/2018 | Zhang | |

FOREIGN PATENT DOCUMENTS

| | | |
|---|---|---|
| CN | 204334664 U | 5/2015 |
| CN | 104900676 A | 9/2015 |
| CN | 104954519 A | 9/2015 |
| CN | 105094307 A | 11/2015 |
| CN | 105573488 A | 5/2016 |
| CN | 106502526 A | 3/2017 |
| CN | 106537319 A | 3/2017 |
| CN | 106603772 A | 4/2017 |
| CN | 106878564 A | 6/2017 |
| CN | 106921767 A | 7/2017 |
| CN | 107170384 A | 9/2017 |
| CN | 206470649 U | 9/2017 |

OTHER PUBLICATIONS

International Search Report dated Aug. 23, 2018 in the corresponding international application (applilcation No. PCT/CN2018/091335).
TW Office Action dated Jan. 19, 2019 in the corresponding TW application (application No. 107122423).
The Third Office Action of Chinese Patent Application No. 201710920204.0.

* cited by examiner

ELECTRONIC TERMINAL AND DISPLAY SCREEN HAVING A CAMERA UNDER A DISPLAY AREA

CROSS-REFERENCES TO RELATED APPLICATIONS

This application is a continuation application for International Application PCT/CN2018/091335, filed on Jun. 14, 2018, which claims the priority benefit of Chinese Patent Application No. 201710920204.0, titled "ELECTRONIC TERMINAL AND DISPLAY SCREEN" and filed on Sep. 30, 2017, and Chinese Patent Application No. 201721289245.6, titled "DISPLAY SCREEN AND ELECTRONIC TERMINAL" and filed on Sep. 30, 2017. The entireties of these applications are incorporated by reference herein for all purposes.

TECHNICAL FIELD

The present disclosure relates to the field of display technologies.

BACKGROUND

The use of a full screen in an electronic terminal can increase the aesthetics of the electronic terminal, giving the electronic terminal more high-tech feeling. Since the electronic terminal needs to have a front camera, in order to ensure that a proper functioning of the front camera, it is generally needed to provide a mounting hole or a slot on the display screen to install the front camera, which may result in a poor display effect in the full screen of the electronic terminal.

SUMMARY

Based on the above, it is desirable to provide an electronic terminal and a display screen to address the problem of the poor full screen display effect of conventional electronic terminals.

A display screen is provided, including a display region including at least two display areas. The at least two display areas include a first display area and a second display area. The first display area has a screen as a first screen, and the second display area has a screen as a second screen. A light transmittance of the first screen is greater than a light transmittance of the second screen.

In an embodiment, the first screen and the second screen have a same pixel density.

In an embodiment, the first screen is a passive matrix light emitting diode screen, and the second screen is an active matrix light emitting diode screen.

In an embodiment, the first screen is a passive matrix organic light emitting diode screen, and the second screen is an active matrix organic light emitting diode screen.

In an embodiment, the display screen further includes a driving unit. The driving unit is respectively connected to the first screen and the second screen. The driving unit is configured to independently drive the first screen and the second screen for display respectively.

In an embodiment, cathodes of all pixels of the first screen are connected together, and cathodes of all pixels of the second screen are connected together. A cathode of the first screen is connected to a cathode of the second screen. The driving unit has a plurality of output ends. The anode of each pixel of both of the first screen and the second screen is respectively connected to a corresponding one of the plurality of output ends of the drive unit.

In an embodiment, the driving unit includes a first driving unit and a second driving unit; the first driving unit is connected to the first screen, and the second driving unit is connected to the second screen. The first driving unit is used to drive the first screen for display; and the second driving unit is used to drive the second screen for display.

In an embodiment, the first display area is on a side of the second display area.

In an embodiment, an area ratio of the first display area to the second display area is between 1:7 and 1:50.

In an embodiment, a notch is formed on a side of the second display area, and the first display area is disposed in the notch.

In an embodiment, the first display area has a shape matching the notch.

In an embodiment, a height ratio of the first display area to the display screen is between 1:7 and 1:13.

In an embodiment, the first screen is integrally formed with the second screen.

In an embodiment, the first display area is in a shape of a circle. The first display area is located inside the second display area, and the first display area and the second display area form an entire area of the display screen.

In an embodiment, a pixel density of the first display area is lower than a pixel density of the second display area.

An electronic terminal is also provided, including the above display screen and a front device. The front device is disposed in an area where the first display area is located.

In an embodiment, the electronic terminal further includes a terminal body and a control device. The terminal body is configured to implement a target function of the electronic terminal. The display screen is disposed on at least one side of the terminal body. The front device is disposed inside the terminal body. The control device independently controls the first display area and the second display area respectively. The first display area is controlled by the control device not to display when the front device is enabled.

In an embodiment, the front device includes at least one of an image acquisition element, a photosensitive device, a photoelectric sensor, and a product identification mark.

In the above display screen and electronic terminal, the display region of the display screen includes at least two display areas. The at least two display areas include a first display area and a second display area. The first display area has a screen as a first screen, and the second display area has a screen as a second screen. A light transmittance of the first screen is greater than a light transmittance of the second screen. Therefore, when the display screen is applied to an electronic terminal, a front device of the electronic terminal may be disposed in the area where the first display area is located (i.e., the area where the first screen is located). When the front device is enabled, the control device controls the first display area (i.e., the first screen) not to display and controls the second display area (i.e., the second screen) to normally display an image to be displayed. At this time, the first display area (i.e., the first screen) is transparent to light, so the front device can operate normally. When the front device is disabled, the control device controls all the screens of the display screen to display the image to be displayed to implement a full screen display. Therefore, the present disclosure can improve the full screen display effect of the electronic terminal.

DETAILED DESCRIPTION OF THE INVENTION

In order to make objects, features and advantages of the application described above more clearly and easier to be understood, the specific embodiments of the application will be illustrated in detail below in conjunction with accompanying drawings.

A display screen may be applied to an electronic terminal to implement a full screen display of the electronic terminal. The electronic terminal may be a mobile phone, a tablet computer, a palmtop computer, or the like. The electronic terminal includes a terminal body, the above display screen, a front device, a control device, and the like. The terminal body is configured to implement a target function of the electronic terminal. The control device is configured to control the operation of the electronic terminal. The front device includes at least one of an image acquisition element, a photosensitive device, a photoelectric sensor, and a product identification mark. The image acquisition element may be a camera or the like. In this embodiment, the above display screen is described in detail by taking the electronic terminal as a mobile phone as an example.

The disclosure provides a display screen including a display region. The display region includes at least two display areas. The at least two display areas include a first display area and a second display area. The first display area has a screen as a first screen. The second display area has a screen as a second screen. A light transmittance of the first screen is greater than a light transmittance of the second screen.

In the above display screen, the first screen and the second screen may display simultaneously or asynchronously, and the light transmittance of the first screen is greater than the light transmittance of the second screen. Therefore, when the display screen is applied to the electronic terminal, the front device of the electronic device may be disposed under the first display area (i.e., the area where the first screen is located). When the first display area (i.e., the area where the first screen is located) is disenabled, the front device can operate normally through the first display area (i.e., the area where the first screen is located).

When the front device is enabled, the control device controls the first display area (i.e., the area where the first screen is located) not to display, and the control device controls the second display area (i.e., the area where the second screen is located) to normally display the image to be displayed. Although the first display area is disenabled, the first display area is transparent to light, so the front device can operate normally.

When the front device is disenabled, the control device controls all the screens of the display screen to display the image to be displayed, which implements a full screen display, so that the electronic terminal has a well display effect.

Figure 1:
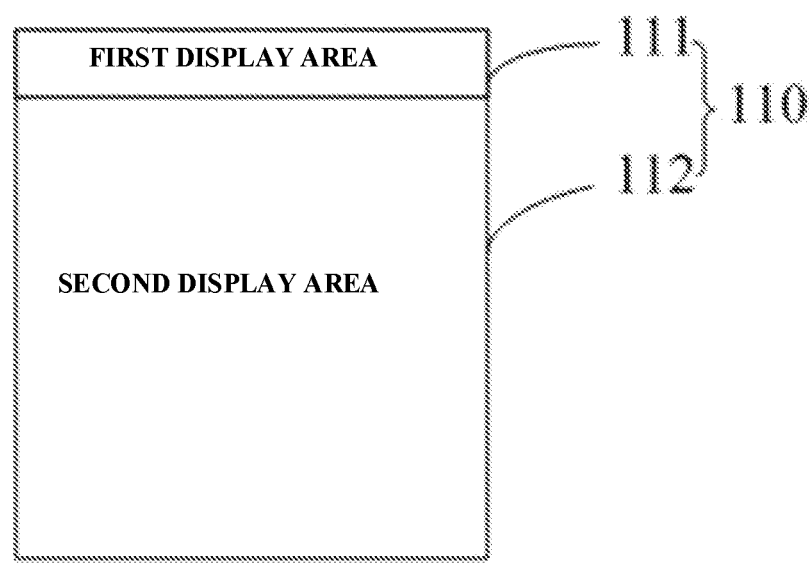
FIG. 1 is a schematic diagram of a display screen of an electronic terminal according to an embodiment.

FIG. 1 is a schematic view of a display screen according to an embodiment. The display screen 110 includes a display region. The display region includes a first display area 111 and a second display area 112, that is, the display region is divided into two display areas. The first display area 111 has a screen as a first screen, and the second display area 112 has a screen as a second screen. A light transmittance of the first screen is greater than a light transmittance of the second screen. In this embodiment, in addition to the difference in light transmittance between the first screen and the second screen, the first display area 111 and the second display area 112 are the same in display effect, so that the display effect of the display screen is not affected by dividing the display screen.

The display screen 110 may be disposed on at least one side of the terminal body. In an embodiment, the display screen 110 may be disposed only on the front side of the terminal body. The display screen 110 may be a full screen, that is, the display screen 110 occupies the entire area of the front side of the electronic terminal.

The first screen and the second screen have a same pixel density. That is, the first display area 111 and the second display area 112 both have a high resolution, so that the display effects of the first display area 111 and the second display area 112 can be same. Thereby the full screen display of the display screen 110 is good.

The first screen can be a passive matrix light emitting diode screen. In this embodiment, the first screen is a passive matrix organic light emitting diode (PMOLED) screen. The PMOLED screen is a passively driven OLED (organic light emitting diode), which is formed in a matrix by a cathode and an anode, and pixels in the matrix are illuminated in a scanning manner. Each pixel is operated in a short pulse mode for instant high brightness illumination. The wiring of the PMOLED screen is simple, which results a high light transmittance and low cost. Therefore, the use of a PMOLED screen allows and facilitates an electronic terminal with a front device to implement a full screen display.

Since the PMOLED screen has no TFF (thin film transistor) backplane and metal wiring, the light transmittance is high. When the front device disposed under the first display area is enabled, the first display area does not display any image, and thus the front device can obtain light from the first display area. When the front device disposed under the first display area is disenabled, the first display area can display the image normally. Therefore, when the display is applied to the electronic terminal, the user's experience of using the electronic terminal can be improved.

The second screen can be an active matrix light emitting diode screen. In this embodiment, the screen where the second display area 112 is located is an active matrix organic light emitting diode (AMOLED) screen. The AMOLED screen is an actively driven OLED that uses an independent thin film transistor to control each pixel, each of which can be continuously and independently driven for illumination. Specifically, the pixel may be driven by a low-temperature polysilicon or oxide thin film transistor (TFT), with advantages of low driving voltage and long life of the light-emitting assembly. And the AMOLED screen is driven by a dynamic driving circuit, which has the advantage of fast response. In addition, the AMOLED screen has a high contrast ratio and a good display effect, which further improves the display effect of the display screen 110. Further, the area ratio of the PMOLED screen to the AMO- LED screen may be between 1:7 and 1:50. For example, a PMOLED screen can occupy one tenth of the area of the display screen 110. In this way, when the image acquisition element is enabled, the AMOLED screen displays an image normally, and the PMOLED screen does not affect the display effect of the AMOLED screen.

When the first display area 111 is a PMOLED screen and the second display area 112 is an AMOLED screen, the pixel density of the first display area 111 may be lower than the pixel density of the second display area 112. When the first display area 111 is not required to display an image, the first display area 111 can maximize the transparency effect, and the front device of the electronic terminal can obtain light through the first display area 111 for imaging. Since the first display area 111 still has pixels, when the first display area 111 is required to display an image, the image can be displayed on the first display area 111.

Figure 2:
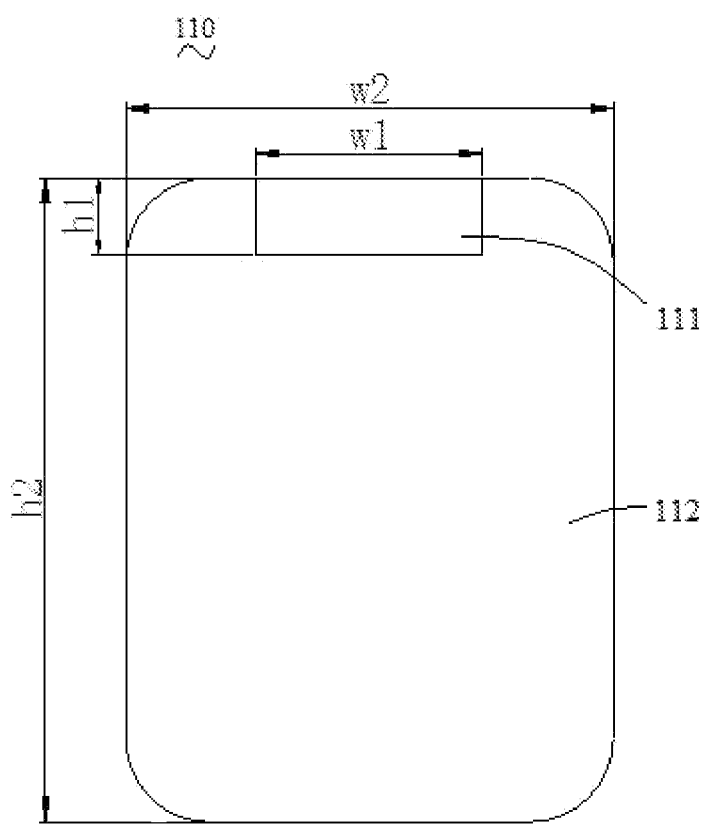
FIG. 2 is a structural schematic diagram of a display screen according to an embodiment.

FIG. 2 is a structural schematic diagram of a display screen according to an embodiment. The first display area 111 is on a side of the second display area 112. For example, the first display area 111 is at the top of the second display area 112, and the top end of the first display area 111 is flush with the top end of the second display area 112. Thereby, the first display area 111 is located at the edge of an entire area of the display screen 110, and the influence on the display screen effect can be reduced.

When the display screen is applied to an electronic terminal, the front device of the electronic terminal can be disposed in the area where the first display area is located. When the front device is enabled, the first display area does not display any image, and the front device can obtain sufficient light through the first display area 111. When the front device is disenabled, the first display area 111 which has a higher resolution can display the image normally.

In an embodiment, the area ratio of the first display area 111 to the second display area 112 may be between 1:7 and 1:50. This configuration allows the user to have the best experience of the electronic terminal such as a mobile phone. In addition, since the area of the first display area is relatively small, it is advantageous to reduce the power consumption of the entire display screen 110.

In an embodiment, a notch (at a position where the first display area 111 is located) is formed on a side of the second display area 112, and the first display area 111 is disposed in the notch. The shape of the first display area 111 matches the notch. At this time, the first display area 111 and the second display area 112 form the entire area of the display screen 110. When an image is displayed, the image can be display on the entire area of the display screen 110 since the entire area of the display screen 110 has pixels, which can improve the user's experience of using the display screen 110.

Specifically, the notch may be in a shape of a rectangle. Of course, the shape of the notch is not limited thereto, and may be other shapes that allow the front device to obtain light.

In an embodiment, a ratio of the height h1 of the first display area 111 to the height h2 of the display screen 110 may be between 1:7 and 1:13. This configuration allows the first display area to have a higher resolution when the image is displayed, and to have a better light transmittance when no image is displayed on the first display area, thereby reducing the power consumption of the entire display screen 110.

In an embodiment, the ratio of the width w1 of the first display area 111 to the width w2 of the display screen 110 may be between 1:1 and 1:6. This configuration allows the first display area to have a relatively high resolution when an image is displayed on the first display area—and to have a relatively good light transmittance when no image is displayed on the first display area, thereby reducing the power consumption of the entire display screen 110.

In an embodiment, the screen of the first display area (i.e., the first screen) and the screen of the second display area (i.e., the second screen) are integrally formed. Thereby, it is advantageous to simplify the process of manufacturing the display screen 110 to improve production efficiency and save production cost.

Of course, in another embodiment, the first screen and the second screen may be separately formed by separate manufacturing processes. For example, if the first screen is a PMOLED screen, and the second screen is an AMOLED screen, the thin film transistor (TFT) backplane of the AMOLED screen may be manufactured firstly, then the AMOLED screen is evaporated, and finally the PMOLED screen is evaporated.

The shapes, sizes, and distribution locations of the first display area 111 and the second display area 112 are not limited thereto.

Figure 3:
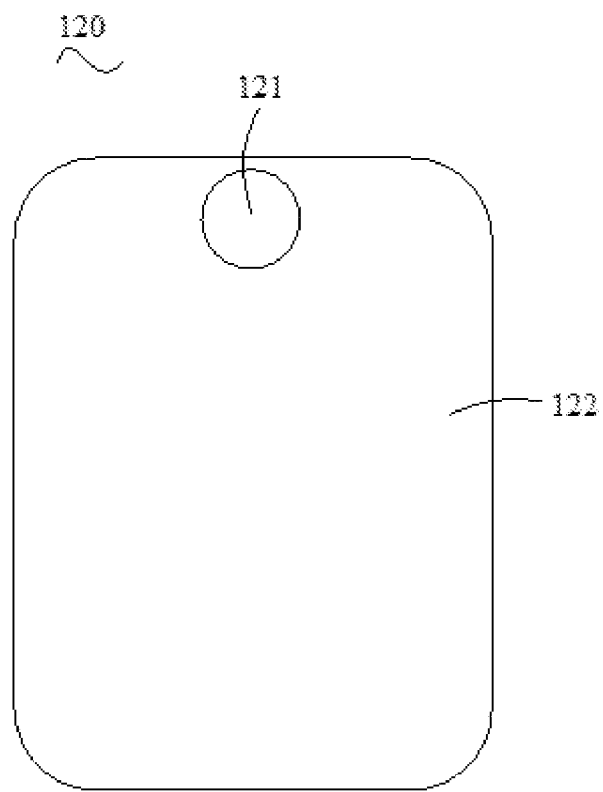
FIG. 3 is a structural schematic diagram of a display screen according to another embodiment.

Referring to FIG. 3, FIG. 3 is a schematic structural diagram of a display screen according to another embodiment. The display screen 120 includes a first display area 121 and a second display area 122. The first display area 121 is circular and located inside the second display area 122. The first display area 121 and the second display area 122 form the entire display screen 120.

Figure 4:
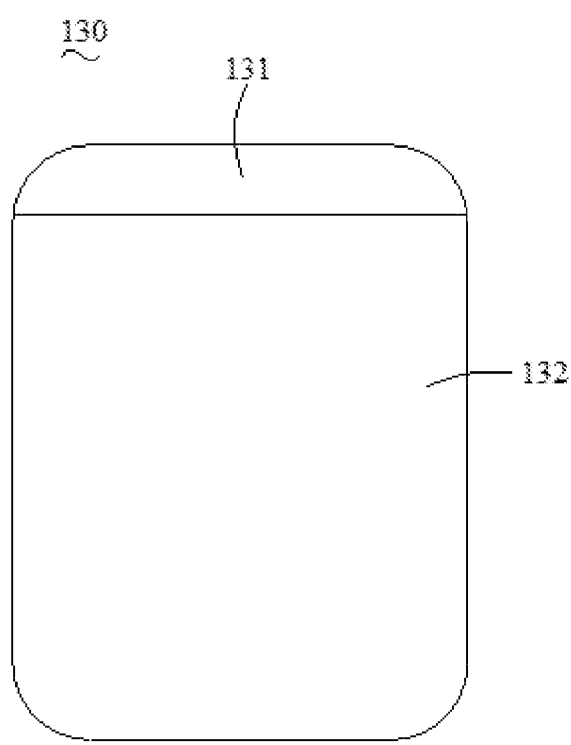
FIG. 4 is a structural schematic diagram of a display screen according to a further embodiment.

Referring to FIG. 4, FIG. 4 is a schematic structural diagram of a display screen according to a further embodiment. The display screen 130 includes a first display screen area 131 and a second display area 132. The first display area 131 is completely located on a side of the second display area 132, and the first display area 131 and the second display area 132 form the entire display screen 130. This configuration can make the manufacturing process of the display screen 130 simpler.

Figure 5:
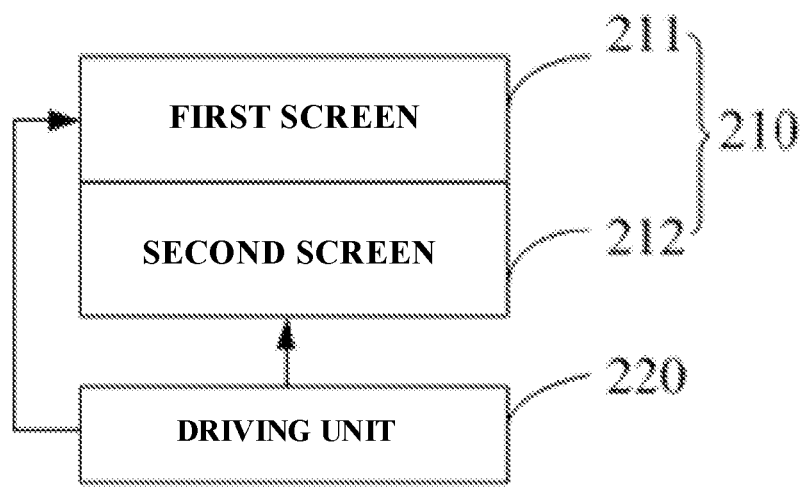
FIG. 5 is a schematic diagram of a driving unit of a display screen according to an embodiment.

The display screen 210 may also include a drive unit 220. FIG. 5 is a schematic diagram of a driving unit of a display screen according to an embodiment. In an embodiment, the driving unit 220 is disposed on the back of the first screen 211 and/or the second screen 212. The driving unit 220 is connected to the control device, and the driving unit 220 is respectively connected to the first screen 211 and the second screen 212 of the display screen 210. The driving unit 220 is configured to independently drive the first screen 211 and the second screen 212 for display. In this way, the simultaneous display of the first screen 211 and the second screen 212 or the separate display of the first screen 211 and the second screen 212 can be enabled.

Specifically, the above display screen can be applied to the electronic terminal. When the front device is disenabled, the control device can control the driving unit 220 to simultaneously drive the first screen 211 and the second screen 212 to display the image to be displayed to implement a full screen display of the image. When the front device is enabled, the control device can control the driving unit 220 to drive only the second screen 212 to work, instead of the first screen 211, so that the image to be displayed is separately displayed by the second screen 212. Therefore, while the front device is in normal operation, the second screen 212 can normally display the image to be displayed.

In an embodiment, the cathodes of all pixels of the first screen are connected together, the cathodes of all pixels of the second screen are connected together, and the cathode of the first screen is connected to the cathode of the second screen.

Specifically, when the first screen is a PMOLED screen and the second screen is a AMOLED screen, the cathode of the PMOLED screen and the cathode of the AMOLED screen are connected to achieve a shared cathode. The cathodes of the PMOLED screen and the cathodes of the AMOLED screen can be leaded to the side of the terminal body which provides a low potential signal VSS to the PMOLED screen and the AMOLED screen through the cathode lead of the PMOLED screen and the cathode lead of the AMOLED screen. This configuration makes the wiring of the display screen simple and simplifies the manufacturing process of the display screen. Moreover, it causes the PMOLED screen to have a high light transmittance, so that the light-catching effect of the front device is good, and when the front device is an image acquisition element, the image acquisition element has a better shooting. Similarly, the anode of each pixel of the PMOLED screen and the anode of each pixel of the AMOLED screen can also be leaded to the side of the terminal body. The driving unit may provide a driving signal VDD to the PMOLED screen and the AMOLED screen through the anode lead of each pixel of the PMOLED screen and the anode lead of each pixel of the AMOLED screen, respectively. In this way, the wiring of the display screen is made simple and the space is fully utilized. In this embodiment, VDD and VSS are provided by wiring inside screen frame, and no additional wiring is required.

The driving unit has multiple output ends. The anode of the each pixel of the first screen and the second screen is respectively connected to a corresponding one of the output ends of the driving unit. In this way, the driving unit can respectively drive a corresponding pixel to display, and can implement the display of different images on the display screen.

Figure 6:
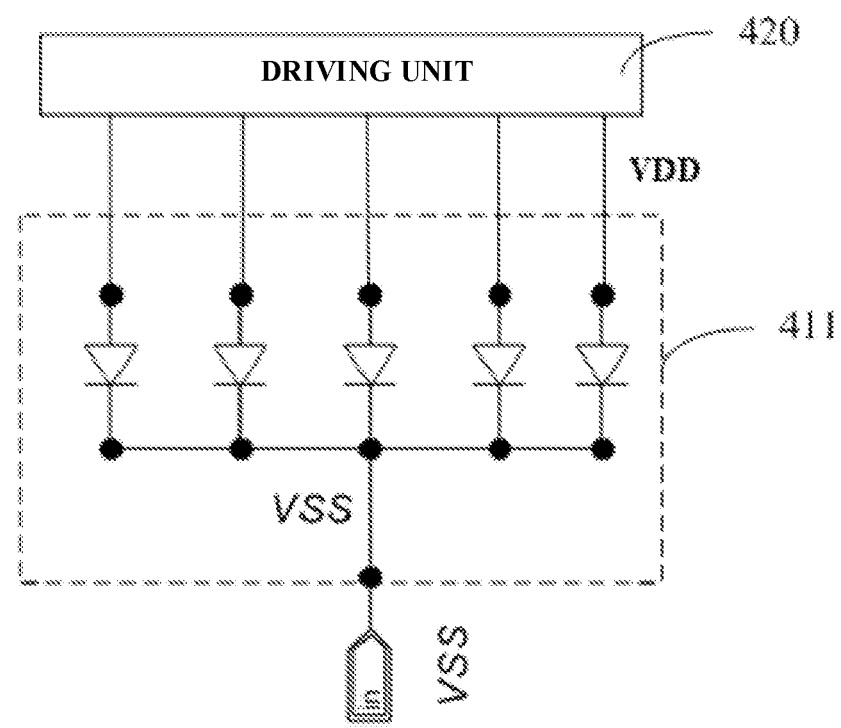
FIG. 6 is a schematic diagram of driving of a first screen according to an embodiment.

FIG. 6 is a schematic diagram of driving of the first screen according to an embodiment. The anode of each pixel of the first screen 411 respectively correspond to one of the output ends of the driving unit 420. In this embodiment, taking the first screen as the PMOLED screen as an example, when the PMOLED screen displays, the driving unit 420 gives each pixel of the PMOLED screen with an appropriate anode voltage, so that the PMOLED screen emits light. The magnitude of the anode voltage given to each pixel of the PMOLED screen by the driving unit 420 determines the luminous intensity of the PMOLED screen, thereby simply controlling whether or not the PMOLED screen performs display.

In an embodiment, the driving unit may include a first driving unit and a second driving unit. The first driving unit is connected to the first screen, and the second driving unit is connected to the second screen. The first driving unit is configured to drive the first screen for display, and the second driving unit is configured to drive the second screen for display. The control device controls the first driving unit and the second driving unit to emit different driving signals of displaying an image, so that the first screen and the second screen can display different images, which implement split screen display of the display. In addition, the first screen and the second screen have respective wirings, which avoids the case where the first screen and the second screen are connected to the same driving unit, thereby making the wiring of the display screen simpler and simplifying the manufacturing process.

A display screen is also provided in the present disclosure. The display screen includes a first display area and a second display area. The screen of the first display area is a passive matrix light emitting diode screen, and the screen of the second display area is an active matrix light emitting diode screen. Since the passive matrix light emitting diode screen has no TFT backplane nor metal wiring, and the active matrix light emitting diode screen requires a TFT backplane, the light transmittance of the passive matrix light emitting diode screen is greater than the light transmittance of the active matrix light emitting diode screen.

When the display screen is applied to an electronic device, a front device of the electronic device can be disposed under the first display area. When the front device is enabled, the first display area does not display any image, and the front device can obtain light through the first display area. When the front device is disenabled, the first display area can display the image normally. Therefore, when the display screen is applied to the electronic terminal, the full screen display effect of the electronic terminal can be improved, thereby improving the user's experience of using the electronic terminal. In an embodiment, the front device includes at least one of an image acquisition element, a photosensitive device, a photoelectric sensor, and a product identification mark.

The shapes, sizes, and distribution locations of the first display area and the second display area may be as illustrated in FIG. 2 to FIG. 4, and are not described herein. It should be noted that the shapes, sizes, and distribution locations of the first display area and the second display area are not limited thereto.

Figure 7:
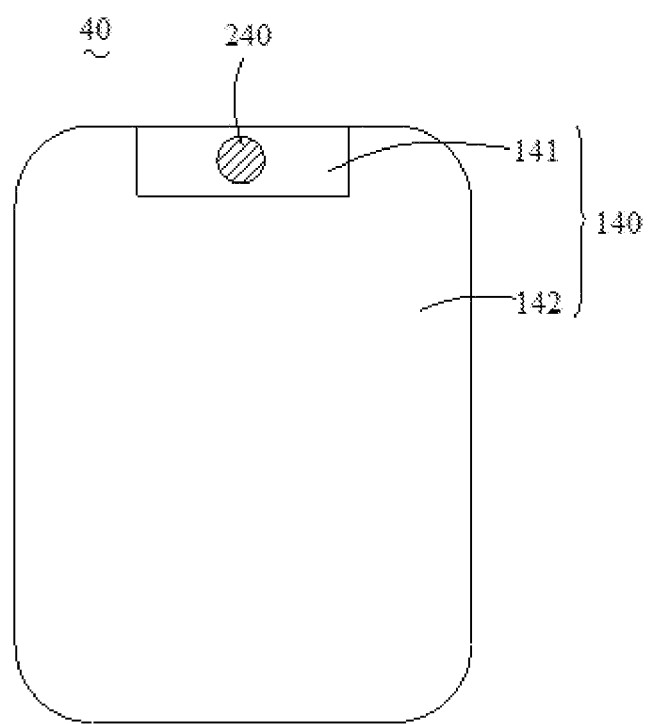
FIG. 7 is a structural schematic diagram of an electronic terminal according to an embodiment.

An electronic terminal is further provided in the present disclosure. Referring to FIG. 7, FIG. 7 is a schematic structural diagram of an electronic terminal according to an embodiment. The electronic terminal 40 includes a terminal body, a display screen 140, a front device 240, a control device, and the like. The display screen 140 may be the display screen described above. The terminal body is configured to implement a target function of the electronic terminal. The control device is configured to control the operation of the electronic terminal. The display screen 140 is disposed on at least one side of the terminal body. The front device 240 is disposed inside the terminal body. The front device 240 is disposed in an area where the first display area 141 is located. The control device independently controls the first display area 141 and the second display area 142, respectively, and controls the first display area 141 not to display when the front device 240 is enabled.

In an embodiment, the front device 240 includes at least one of an image acquisition element, a photosensitive device, and a product identification mark. Of course, the front device 240 is not limited thereto.

In an embodiment, the front device 240 may be disposed so as to face the first display area 141.

When the front device 240 needs to be enabled, the control device controls the first display area 141 not to display any image, and the light can travel to the front device 240 through the first display area 141, so that the front device 240 obtains light to implement its function. Specifically, for example, the front device may be an image acquisition element, such as a camera or the like. The image acquisition element may be configured to obtain light passing through the first display area to capture a scene opposite to the display screen. The control device is connected to the display screen and the image acquisition element respectively. When the user activates the image acquisition element, that is, when the control device receives the activation signal of the image acquisition element or detects that the image acquisition element is enabled, the control device controls the first display screen area not to display any image. The control device performs normal control on the second display area, and controls the second display area of the display screen to display the image to be displayed. At the same time, the control device may control the operation of the image acquisition element. When the user deactivates the image acquisition element, that is, when the control device receives a deactivation signal of the image acquisition element or detects that the image acquisition element is disabled, the control device controls all display areas of the display screen to perform display normally, thereby implement the full screen display.

In the embodiment, the area of the front device 240 is smaller than the area of the first display area 141. Thus, when the front device 240 is enabled, the first display area 141 having a larger area can permit enough light transmission to complete the proper function of the front device.

In other embodiments, the area of the front device 240 may also be the same as the area of the first display area 141, as long as the projection of the first display area 141 on the front device 240 completely covers the front device 240.

An electronic terminal is further provided in the present disclosure. The electronic terminal includes a display screen and a front device. The display screen may be the display screen described above. The front device is disposed in the area where the first display area of the display screen is located. The front device includes at least one of an image acquisition element, a photosensitive device, a photoelectric sensor, and a product identification mark. When the front device disposed in the area where the first display area is located is enabled, the first display area does not display any image, and the front device can obtain light through the first display area. When the front device disposed in the area where the first display area is located is disenabled, the first display area can display the image normally. Therefore, the full screen display effect of the electronic terminal can be enhanced, thereby improving the user's experience of using the electronic terminal.

It should be noted that the above display screen is not limited to the electronic terminal with the front device, and can also be applied to other electronic terminals with no front device, that is, the display screen can be applied to any electronic terminal. The technical features of the above embodiments may be arbitrarily combined. For the sake of brevity of description, all possible combinations of the technical features in the above embodiments are not described herein. However, as long as there is no contradiction in the combination of these technical features, it shall be considered to be within the scope described in this disclosure.

The above-mentioned embodiments are merely illustrative of several embodiments of the present disclosure, and the description thereof is more specific and detailed, but is not to be construed as limiting the scope of the disclosure. It should be noted that a number of variations and modifications may be made by those skilled in the art without departing from the spirit and scope of the present disclosure. Therefore, the scope of the disclosure should be determined by the appended claims.

The invention claimed is:

1. A display screen, comprising a display region comprising at least two display areas, the at least two display areas comprising a first display area and a second display area, the first display area having a first screen, the second display area having a second screen, and a light transmittance of the first screen being greater than a light transmittance of the second screen;

wherein the display screen further comprises a driving unit respectively connected to the first screen and the second screen, and the driving unit is configured to independently drive the first screen and the second screen;

wherein:
cathodes of all pixels of the first screen are interconnected;
cathodes of all pixels of the second screen are interconnected;
a cathode of the first screen is connected to a cathode of the second screen;
the driving unit comprises a plurality of output ends; and
an anode of each pixel of both of the first screen and the second screen is respectively connected to a corresponding one of the plurality of output ends of the driving unit;

wherein the first screen is a PMOLED screen and the second screen is an AMOLED screen, the cathodes of the PMOLED screen and the cathodes of the AMOLED screen are connected to a terminal body which provides a low potential signal VSS to the PMOLED screen and the AMOLED screen through a cathode lead of the PMOLED screen and a cathode lead of the AMOLED screen, the cathode leads of the PMOLED are arranged on a side of the terminal body for high light transmittance of the first screen;

wherein each pixel of the first screen is operated in a short pulse mode for instant high brightness illumination;

wherein a pixel density of the first display area is lower than a pixel density of the second display area to enhance transparency effect of the first display area for imaging function; and wherein the display screen is coupled to a front device disposed in an area where the first display area is located, wherein the front device comprises at least one of an image acquisition element, a photosensitive device, and a photoelectric sensor.

2. The display screen according to claim 1, wherein,
when the front device disposed under the first display area is enabled, the first display area does not display any image, and the front device obtains light from the first display area;
when the front device disposed under the first display area is disenabled, the first display area and the second display area display an image to implement a full screen display.

3. The display screen according to claim 1, wherein the first screen is a passive matrix light emitting diode screen, and the second screen is an active matrix light emitting diode screen.

4. The display screen according to claim 3, wherein the first screen is a passive matrix organic light emitting diode screen, and the second screen is an active matrix organic light emitting diode screen.

5. The display screen according to claim 1, wherein:
the driving unit comprises a first driving unit and a second driving unit;
the first driving unit is connected to the first screen, and the second driving unit is connected to second screen;
the first driving unit is configured to drive the first screen for display; and
the second driving unit is configured to drive the second screen for display.

6. The display screen of claim 1, wherein the first display area is on a side of the second display area.

7. The display screen according to claim 1, wherein an area ratio of the first display area to the second display area is between 1:7 and 1:50.

8. The display screen according to claim 1, wherein a notch is formed on a side of the second display area, and the first display area is disposed in the notch.

9. The display screen according to claim 8, wherein the first display area has a shape matching the notch.

10. The display screen according to claim 9, wherein a height ratio of the first display area to the display screen is between 1:7 and 1:13.

11. The display screen according to claim 1, wherein the first screen is integrally formed with the second screen.

12. The display screen according to claim 1, wherein the first display area is in a shape of a circle, the first display area is located inside the second display area, and the first display area and the second display area form an entire area of the display screen.

13. An electronic terminal, comprising the display screen that comprises:
   a display region comprising at least two display areas, the at least two display areas comprising a first display area and a second display area, the first display area having a first screen, the second display area having a second screen, and a light transmittance of the first screen being greater than a light transmittance of the second screen;
   a front device disposed in an area where the first display area is located, wherein the front device comprises at least one of an image acquisition element, a photosensitive device, and a photoelectric sensor; and
   a driving unit respectively connected to the first screen and the second screen, and the driving unit is configured to independently drive the first screen and the second screen;
   wherein:
      cathodes of all pixels of the first screen are interconnected;
      cathodes of all pixels of the second screen are interconnected;
      a cathode of the first screen is connected to a cathode of the second screen;
      the driving unit comprises a plurality of output ends; and
      an anode of each pixel of both of the first screen and the second screen is respectively connected to a corresponding one of the plurality of output ends of the driving unit;
   wherein the first screen is a PMOLED screen and the second screen is an AMOLED screen, the cathodes of the PMOLED screen and the cathodes of the AMOLED screen are connected to a terminal body which provides a low potential signal VSS to the PMOLED screen and the AMOLED screen through a cathode lead of the PMOLED screen and a cathode lead of the AMOLED screen, the cathode leads of the PMOLED are arranged on a side of the terminal body for high light transmittance of the first screen;
   wherein each pixel of the first screen is operated in a short pulse mode for instant high brightness illumination; and
   wherein a pixel density of the first display area is lower than a pixel density of the second display area to enhance transparency effect of the first display area for imaging function.

14. An electronic terminal comprising a display screen that comprises:
   a display region comprising at least two display areas, the at least two display areas comprising a first display area and a second display area, the first display area having a first screen, the second display area having a second screen, and a light transmittance of the first screen being greater than a light transmittance of the second screen; and
   a front device disposed in an area where the first display area is located, wherein the front device is an imaging device;
   wherein the electronic terminal further comprises a terminal body and a control device, wherein:
   the terminal body is configured to implement a target function of the electronic terminal;
   the display screen is disposed on at least one side of the terminal body;
   the front device is disposed inside the terminal body; and
   the control device independently controls the first display area and the second display area respectively, and the first display area is controlled by the control device not to display when the front device is enabled;
   wherein the display screen further comprises a driving unit respectively connected to the first screen and the second screen, and the driving unit is configured to independently drive the first screen and the second screen;
   wherein:
      cathodes of all pixels of the first screen are interconnected;
      cathodes of all pixels of the second screen are interconnected;
      a cathode of the first screen is connected to a cathode of the second screen;
      the driving unit comprises a plurality of output ends; and
      an anode of each pixel of both of the first screen and the second screen is respectively connected to a corresponding one of the plurality of output ends of the driving unit;
   wherein the first screen is a PMOLED screen and the second screen is an AMOLED screen, the cathodes of the PMOLED screen and the cathodes of the AMOLED screen are connected to the terminal body which provides a low potential signal VSS to the PMOLED screen and the AMOLED screen through a cathode lead of the PMOLED screen and a cathode lead of the AMOLED screen, the cathode leads of the PMOLED are arranged on a side of the terminal body for high light transmittance of the first screen;
   wherein each pixel of the first screen is operated in a short pulse mode for instant high brightness illumination; and
   wherein a pixel density of the first display area is lower than a pixel density of the second display area to enhance transparency effect of the first display area for imaging function.

15. The electronic terminal of claim 14, wherein the front device comprises at least one of an image acquisition element, a photosensitive device, and a photoelectric sensor.

* * * * *